(12) United States Patent
Gaboriau et al.

(10) Patent No.: US 7,477,079 B2
(45) Date of Patent: Jan. 13, 2009

(54) SINGLE ENDED SWITCHED CAPACITOR CIRCUIT

(75) Inventors: Johann G. Gaboriau, Austin, TX (US); Joseph J. Welser, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 6 days.

(21) Appl. No.: 10/938,002

(22) Filed: Sep. 10, 2004

(65) Prior Publication Data

US 2006/0055436 A1    Mar. 16, 2006

(51) Int. Cl.
*H03K 17/00* (2006.01)

(52) U.S. Cl. ............................. 327/94; 327/95; 327/96; 341/122

(58) Field of Classification Search ................ 327/554, 327/341, 337, 336, 96, 95, 94, 536
See application file for complete search history.

(56) References Cited

U.S. PATENT DOCUMENTS

| | | | | |
|---|---|---|---|---|
| 5,281,860 A | * | 1/1994 | Krenik et al. ............... | 327/407 |
| 5,363,102 A | | 11/1994 | Ferguson .................... | 341/172 |
| 5,376,936 A | | 12/1994 | Kerth et al. ................. | 341/150 |
| 5,479,130 A | * | 12/1995 | McCartney ................. | 327/341 |
| 5,990,819 A | * | 11/1999 | Fujimori ..................... | 341/150 |
| 6,023,191 A | * | 2/2000 | Connell et al. .............. | 327/554 |
| 6,031,399 A | | 2/2000 | Vu et al. ....................... | 327/96 |
| 6,147,522 A | | 11/2000 | Rhode et al. ................. | 327/93 |
| 6,194,946 B1 | | 2/2001 | Fowers ......................... | 327/337 |
| 6,351,506 B1 | * | 2/2002 | Lewicki ....................... | 375/350 |
| 6,433,712 B1 | | 8/2002 | Ohnhaeuser et al. ........ | 341/118 |
| 6,509,791 B2 | * | 1/2003 | Segawa et al. .............. | 327/554 |
| 6,556,072 B1 | * | 4/2003 | Nicollini et al. ............. | 327/554 |
| 6,573,850 B1 | | 6/2003 | Pennock ...................... | 341/150 |
| 6,617,908 B1 | | 9/2003 | Thomsen et al. ............ | 327/337 |
| 6,628,217 B1 | | 9/2003 | Dunne ......................... | 341/143 |
| 2002/0167353 A1 | * | 11/2002 | Segawa et al. .............. | 327/554 |
| 2003/0179122 A1 | | 9/2003 | Yamamura .................. | 341/150 |

FOREIGN PATENT DOCUMENTS

EP    0899884    3/1999

OTHER PUBLICATIONS

IEEE, "Delta-Sigma Data Converters: Theory, Design, and Simulation," editors S. Norsworthy et al., pp. 384-386 1997.

* cited by examiner

*Primary Examiner*—Quan Tra
*Assistant Examiner*—Khareem E. Almo
(74) *Attorney, Agent, or Firm*—Wong, Cabello, Lutsch, Rutherford & Brucculeri, LLP

(57) ABSTRACT

A single-ended, non-differential switched capacitor circuit is disclosed which removes the effect of common mode noise. To this end, the circuit creates a capacitance divider using the sampling capacitors, Cs, to create a stable and noise-free common mode voltage (Vcom) signal. Once created, this Vcom signal is coupled across a large common mode capacitance, Ccom, which is preferably off chip, to further control its value. Thereafter, the voltage Vcom is preferably allowed to settle while the data is disconnected. In this way, the Vcom signal is not provided to the circuit, but instead is cleanly generated within the circuit itself when needed. Thereafter, the generated Vcom signal is paralleled with the integration capacitor, C1, to produce the non-differential output voltage Vout. Then, the sampling capacitors, Cs, are shorted to remove any charges stored on them and the process is repeated.

31 Claims, 11 Drawing Sheets phase 1 rough phase 1 fine

*phase 1 settle*

*phase 2*

*phase 3*

SINGLE ENDED SWITCHED CAPACITOR CIRCUIT

FIELD OF THE INVENTION

This invention relates in general to electronic circuits, and in particular to reference voltage circuitry for use in switched-capacitor applications.

BACKGROUND

Computer systems capable of handling audio data typically involve encoders and decoders (i.e., "codecs") capable of converting analog audio data to digital audio data and vice versa. Such codecs generally require digital to analog converters (DACs) and analog to digital converters (ADCs) that operate from reference voltages. For example, a switched capacitor low-pass filter may be used in DACs, which uses reference voltages Vref+ and Vref− as inputs. Such a low-pass filter circuit, as well as further details concerning the context of the use of such circuitry in codecs, is disclosed in U.S. Pat. No. 6,147,522 ("the '522 patent"), which is incorporated herein in its entirety, and with which familiarity is assumed.

A prior art switched capacitor circuit 10 is shown in FIG. 1. Reference inputs Vref+ and Vref− respectively represent filtered versions of power (or Vdd or logic '1') and ground (0V or logic '0'), and are fed to the circuit 10 via switches selectively engaged by a one-bit output (Δ) of a well-known delta-sigma modulator (not shown). A one-bit output is only shown for simplicity, and a multi-bit output could be used and normally would be used in a sophisticated real-life codec application.

In the circuit of FIG. 1, the reference voltages propagate through the circuitry using clocks φ1 and φ2 to selectively close various switches (e.g., transistors or pass gates) as shown in the timing diagram of FIG. 1. During φ1, the sampling capacitors Cs, having typical values of approximately 10 picofarads, are charged in accordance with the data Δ. Specifically, the sampling capacitors Cs are charged to Vin−Vcom, where Vin equals Vref+ for one of the sampling capacitors and Vref− for the other sampling capacitor, and where Vcom represents a common mode voltage which can be any value but is typically ½ Vdd. During φ2, the charge stored on the sampling capacitors Cs are coupled in parallel with (and hence share their charge with) integration capacitors C1, which typically measure approximately 100 picofarads. The shared charge is also fed into the differential inputs of operational amplifier ("op amp") 15, to produce the desired differential analog output, Vout. Providing delayed versions of the clock signals φ1 and φ2 (i.e., φ1d and φ2d) improves this scheme by coupling the charges to and from the various capacitors in an orderly and less noisy fashion, as shown in FIG. 3.

FIG. 1 represents use of the op amp 15 in a differential capacity, with the result being that noise present on Vcom has little to no effect on the output Vout. However, a single-ended architecture is also possible, such as is shown in FIG. 2. This switched capacitor circuit 20 is similar to that disclosed in FIG. 1, but only contains one data path to the op amp 25, with the other input of the op amp being connected to Vcom. While simpler in nature, noise on Vcom in this single-ended scheme directly affects the output voltage, Vout, and so is subject to drawbacks. Although not shown, delayed versions of the clock signals φ1 and φ2 (i.e., φ1d and φ2d as shown in FIG. 3) can be used in the single-ended scheme of FIG. 2 as well, but are not shown for simplicity.

The switched capacitor circuit 40 of FIG. 4, as is disclosed in the above-referenced '522 patent, further improves upon the differential scheme of FIG. 3 by providing two versions of the delayed clock signal (φ1d) responsible for passing data to the plate of the sampling capacitors, Cs. Specifically, the delayed clock signal φ1d is separated into "rough" (φ1dr) and "fine" (φ1df) portions, as shown in the accompanying timing diagram. The rough timing signal φ1dr is used to pass Vdd and ground to the sampling capacitors. This signal passing is both beneficial and detrimental, because while these raw power supply voltages have good drive, they tend to be noisy and unfiltered. However, as these power supply voltages are close in value to Vref+ and Vef−, they are a good starting point for charging the sampling capacitors, Cs, to appropriate values. After this initial charging, the fine timing signal φ1df is used to couple the sampling capacitors to the desired filtered references voltages Vref+ and Vef−. Although not shown, the circuit of FIG. 4 could also be single-ended in nature, similar to the circuit shown in FIG. 2.

Also, in FIG. 4, a capacitor, Cref, which intervenes between the reference voltages Vref+ and Vef−, is shown. Capacitor Cref acts to isolate the reference voltages from one another, and allows voltages Vref+ and Vref− to be passively generated by the circuit as opposed to being actively generated. As it is typically quite large, measuring approximately 10 nanofarads to 10 microfarads, or generally one thousand to one million times bigger than the sampling capacitors, Cref, is typically placed "off chip" from the integrated circuit that includes the switched capacitor circuitry 40 and related electronics (such as the delta sigma modulator etc.). Specifically, capacitor Cref is typically placed on the printed circuit board or other substrate (not shown) to which the integrated circuit is mounted.

Thus, the prior art teaches many different reference voltage circuits and schemes. However, these prior approaches are not optimal. Single-ended schemes such as that disclosed in FIG. 2 are sensitive to noise on voltage Vcom as previously noted. However, differential schemes having differential outputs such as those disclosed in FIGS. 1, 3, and 4 may not be desired by some customers who might want to have to deal with only a single output.

In short, a single-ended scheme not sensitive to noise would be beneficial to the art, and this disclosure presents an example of such an improved scheme.

SUMMARY

A single-ended, non-differential switched capacitor circuit is disclosed which removes the effect of common mode noise. To this end, the circuit creates a capacitance divider using the sampling capacitors, Cs, to create a stable and noise-free common mode voltage (Vcom) signal. Once created, this Vcom signal is coupled across a large common mode capacitance, Ccom, which is preferably off chip, to further control its value. Thereafter, voltage Vcom is preferably allowed to settle while the data is disconnected. In this way, the Vcom signal is not provided to the circuit, but instead is cleanly generated within the circuit itself when needed. Thereafter, the generated Vcom signal is paralleled with the integration capacitor, C1, to produce the non-differential output voltage Vout. Then, the sampling capacitors, Cs, are shorted to remove any charges stored on them, and the process is repeated.

BRIEF DESCRIPTION OF THE DRAWINGS

Embodiments of the inventive aspects of this disclosure will be best understood with reference to the following detailed description, when read in conjunction with the accompanying drawings, in which.

DETAILED DESCRIPTION

Figure 4:
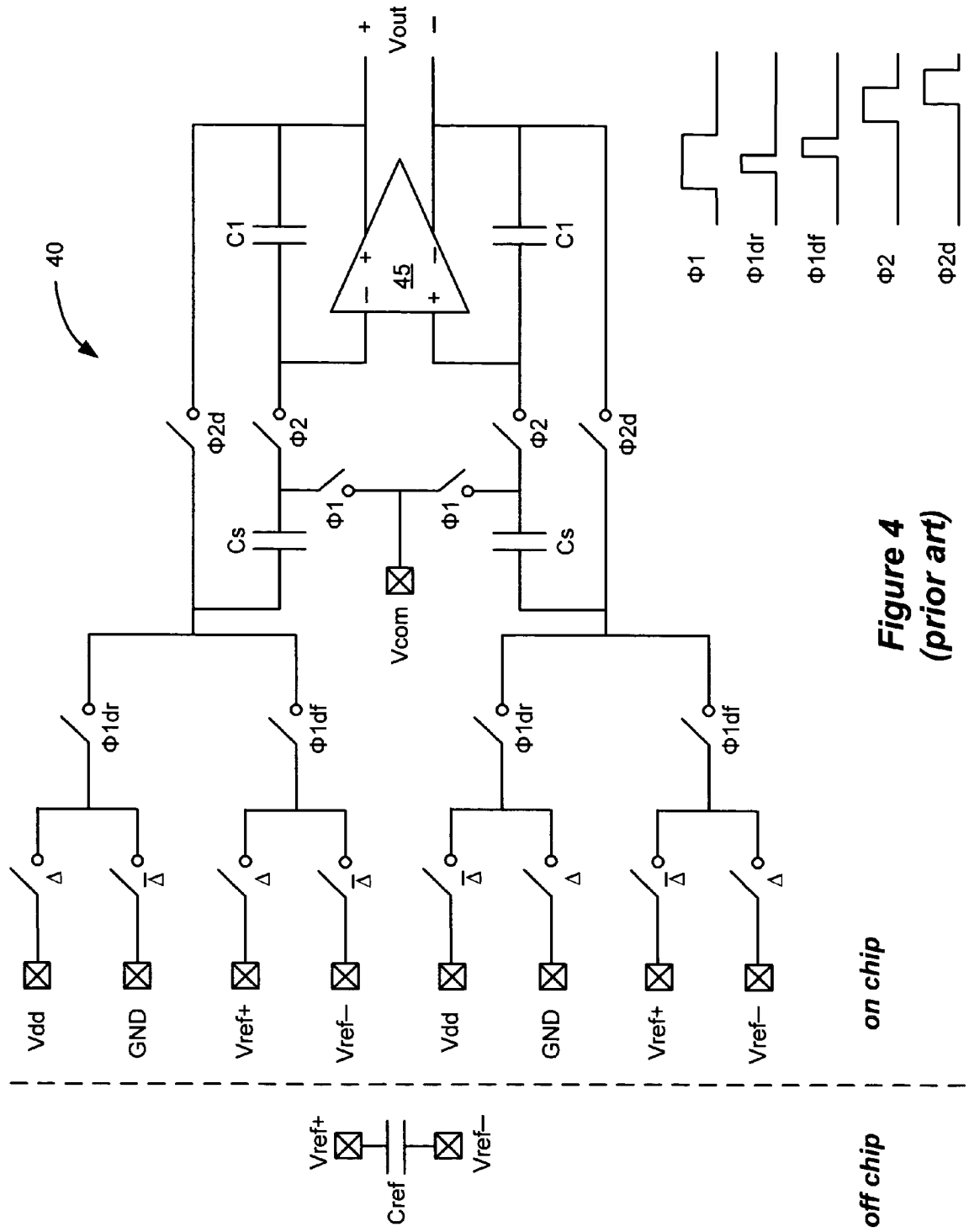
Figure 5A:
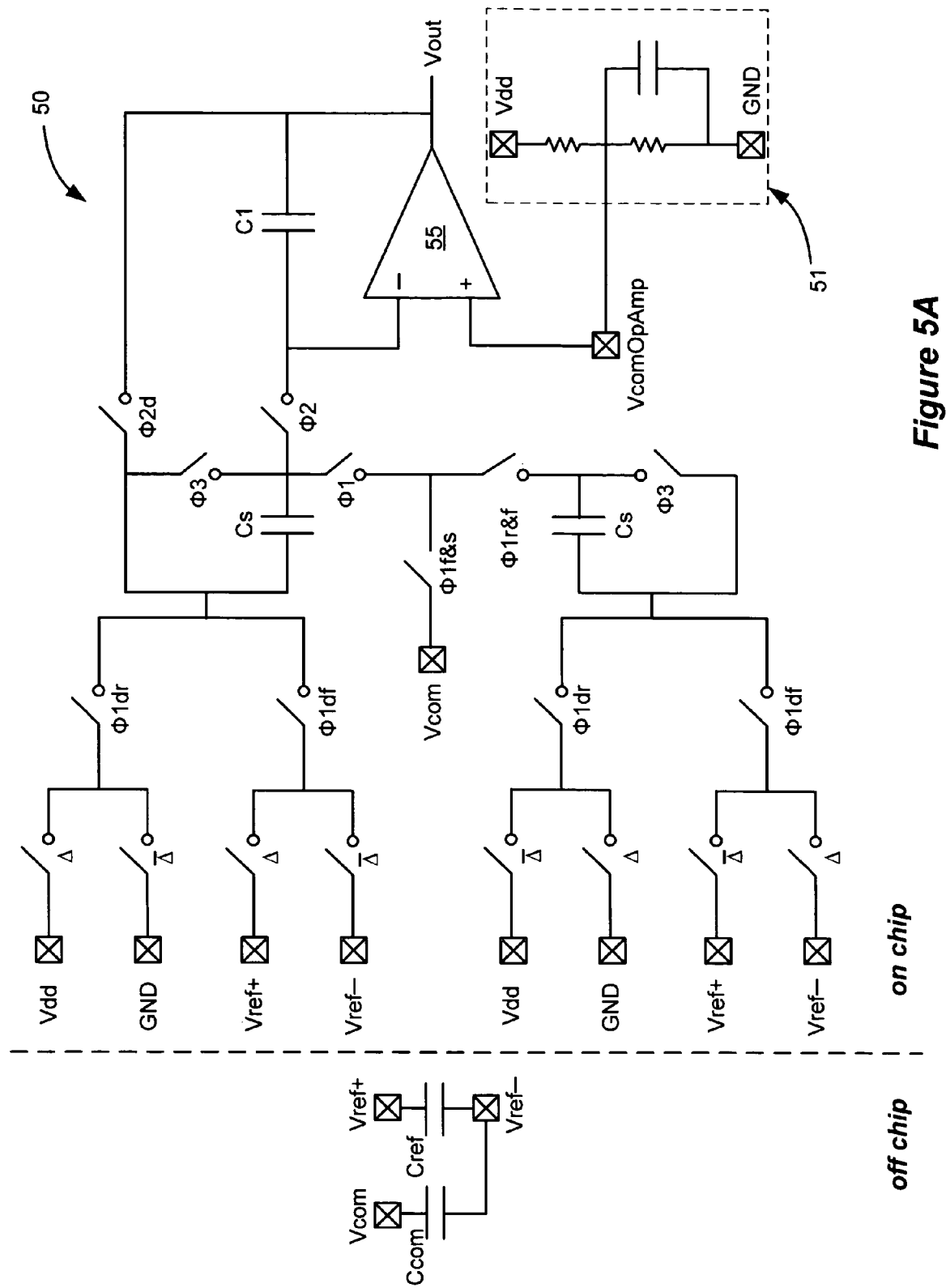
FIG. 5A illustrate an embodiment of the disclosed improved single-ended switched capacitor circuit.

FIG. 5A shows an exemplary embodiment of the improved switched capacitor circuit 50. The circuit 50 is similar in certain respects to the switched capacitor circuit 40 of FIG. 4, but is also different in certain respects. First, the circuit 50 is single-ended, as evidenced by the fact that one of the inputs to the op amp 55 is held at VcomOpAmp (approximately ½ Vdd as evidenced by the voltage divider circuit 51) and because op amp 55 has only one output. Second, an additional common mode filtering capacitor, Ccom, has been added between the common mode voltage, Vcom, and the lower reference voltage, Vref–. Capacitor Ccom is again quite large, on the order of the size of the reference voltage capacitor Cref, and hence like the reference voltage capacitor Cref is preferably placed "off chip" on the printed circuit board. However, this placement is not strictly necessary as both Ccom and Cref can be placed on the integrated circuit if sufficient space exists for them. Third, additional switches have been added to affect which portions of the circuit 50 are active at any given time, as will be explained in further detail below.

Figure 1:
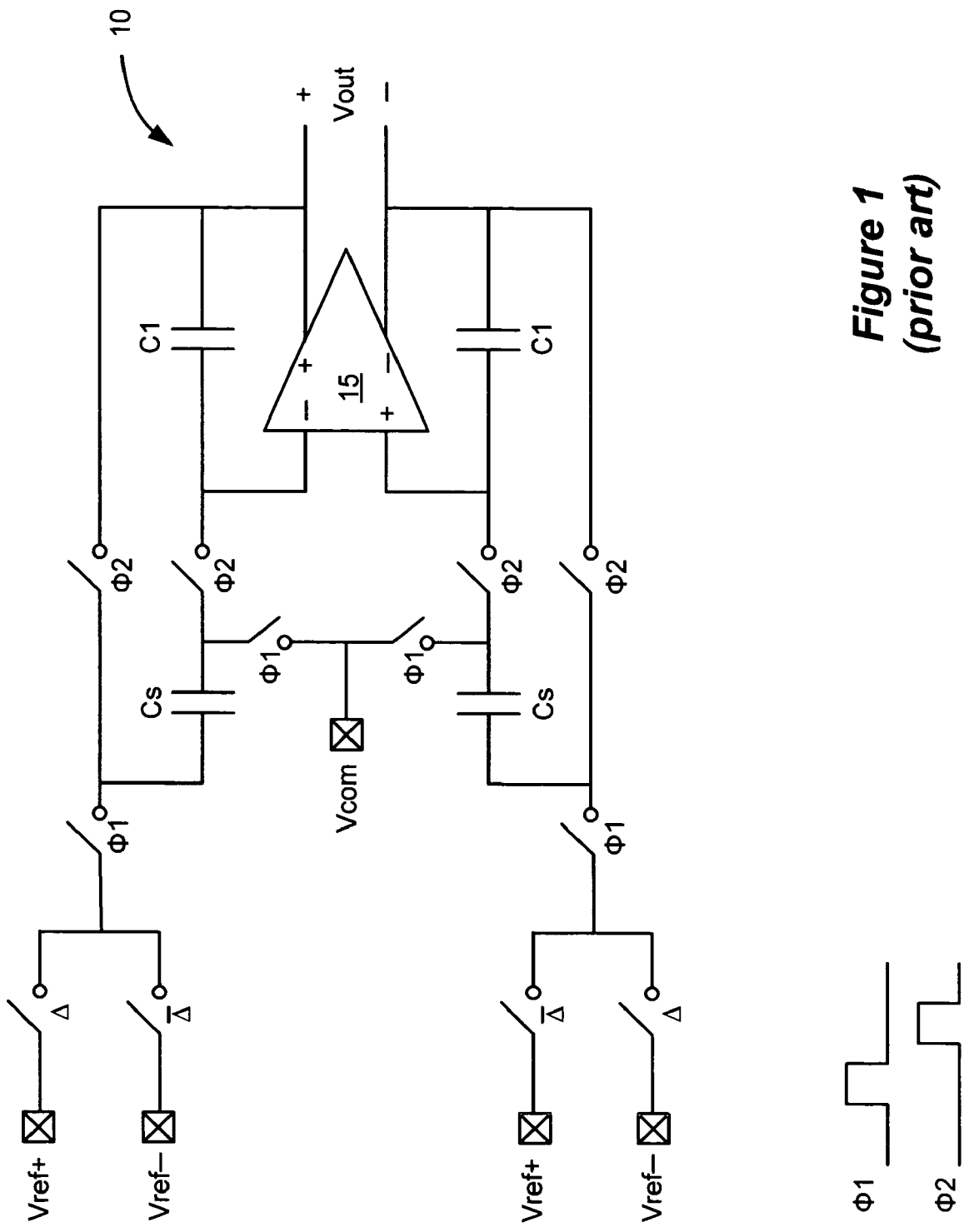
FIGS. 1-4 illustrate prior art switched capacitor circuits.
Figure 2:
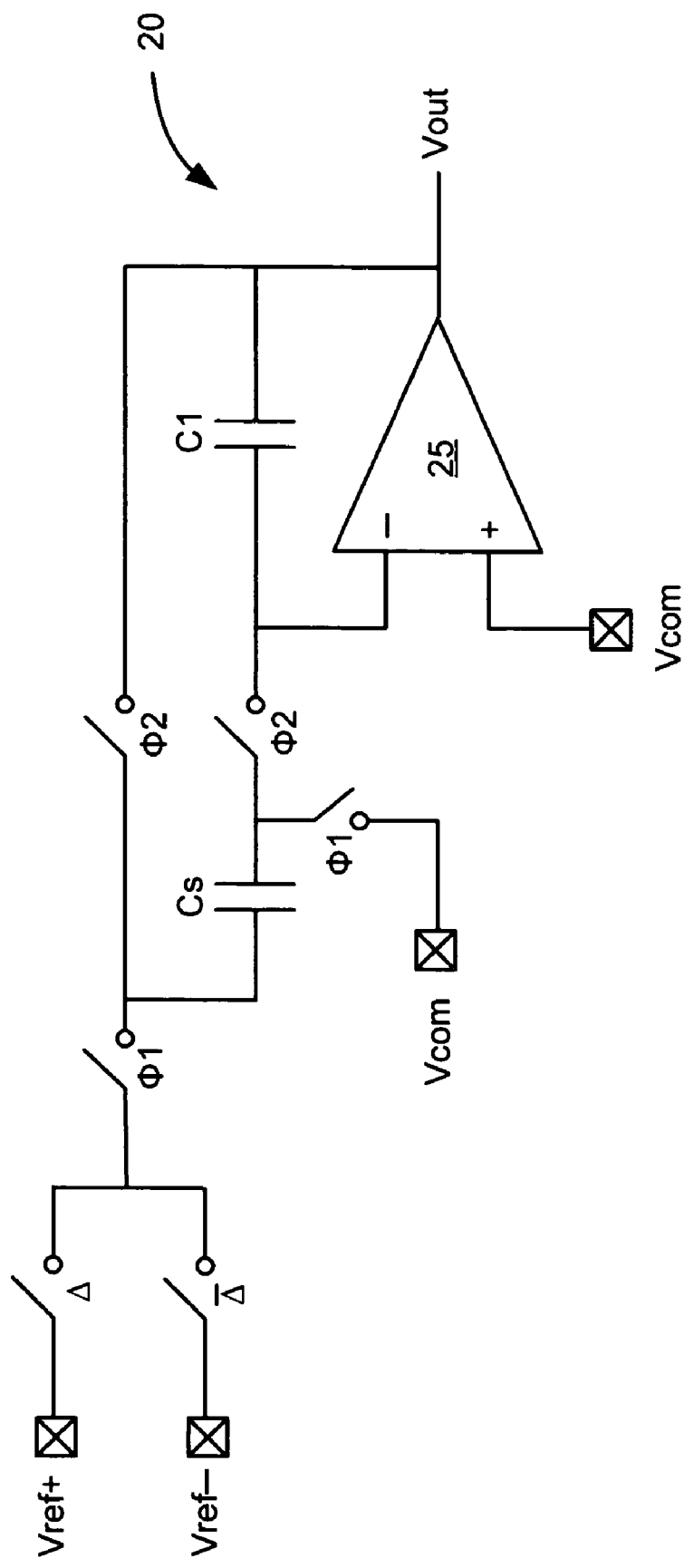
Figure 2:
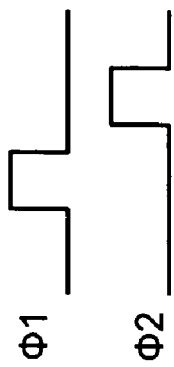

The basic approach to the switched capacitor circuit 50 of FIG. 5A is to provide a single-ended, non-differential solution which removes the effect of common mode noise, such as that which hampers the approach of the circuit of FIG. 2. To this end, the circuit of FIG. 5A in effect creates a capacitance divider using the sampling capacitors, Cs, to create a stable and noise-free Vcom signal. Once created, this Vcom signal is coupled across the large Ccom capacitance to further control its value, and is thereafter preferably allowed to settle while the data is disconnected. Thus, the Vcom signal is not provided to the circuit 50, but instead is cleanly generated within the circuit 50 itself when needed. Thereafter, the generated Vcom signal is paralleled with the integration capacitor, C1, to produce the non-differential output voltage Vout. Then, the sampling capacitors, Cs, are shorted to remove any charges stored on them and the process is repeated.

Figure 5B:
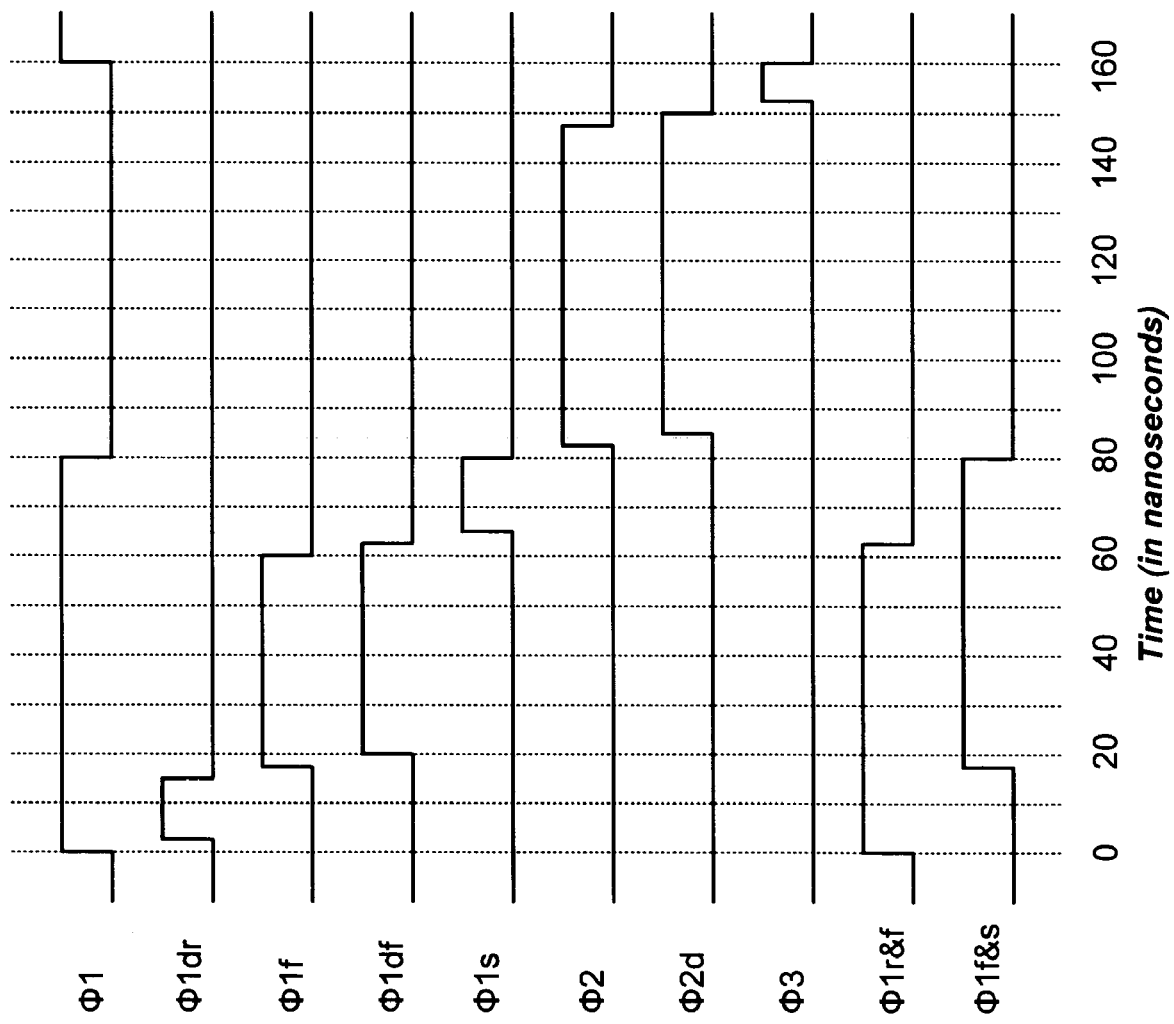
FIG. 5B illustrates the timing signals to be applied to the circuit of FIG. 5A.

Exemplary timing signals used to close the various switches in the circuit of FIG. 5A are shown in FIG. 5B. Phase 1 signals (i.e., ($\phi 1x$) and phase 2 signals (i.e., ($\phi 2x$) largely operate as in the prior art with the phase 1 signals charging the sampling capacitors Cs, and the phase 2 signals acting to share charge between the sampling capacitors Cs and the integration capacitor C1. However, other modifications to the circuitry constitute beneficial changes to the prior art, as discussed below.

FIGS. 6A-6E illustrate the portions of the circuit of FIG. 5A that are activated at various points by the various timing signals of FIG. 5B. Specifically shown are those portions of active circuitry during phase 1 rough ($\phi 1dr$), phase 1 fine ($\phi 1df$), phase 1 settle ($\phi 1s$), phase 2 ($\phi 2$, which includes activation of $\phi 2d$), and phase 3 ($\phi 3$).

Figure 6A:
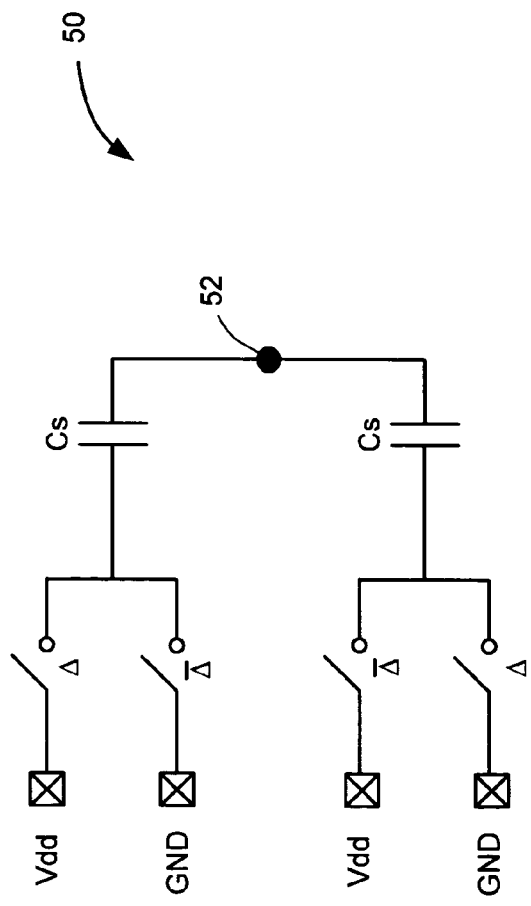
FIGS. 6A-6E illustrate the circuit of FIG. 5A at various points in its activation, specifically, during phase 1 rough, phase 1 fine, phase 1 settle, phase 2, and phase 3.

During phase 1 rough ($\phi 1dr$), and referring to FIG. 6A, the sampling capacitors Cs are presented with data from the delta sigma modulator (not shown) as taken directly from the power supply voltages Vdd and ground. This presentation of this data allows the capacitors Cs to be initially charged with signals having high current and good driving capacity, albeit relatively noisy. The common mode voltage, Vcom, is not within the circuit. Instead, node 52 between the two sampling capacitors will roughly couple to a value intermediate the power supply voltages (i.e., to ½ Vdd). This value can vary depending on the data (Δ), and number of bits of data output from the delta sigma modulator (again, only a one bit output is illustrated to this point for convenience).

Figure 6B:
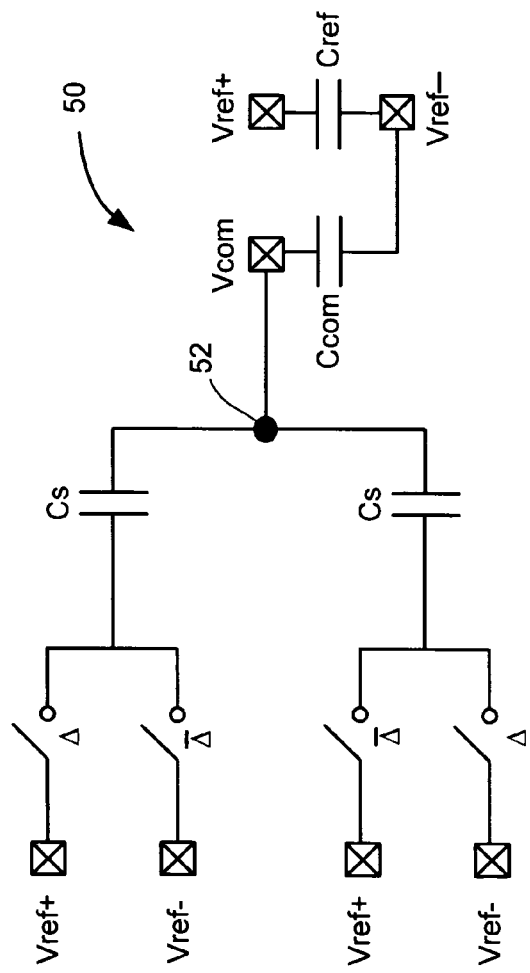

During phase 1 fine ($\phi 1df$), and referring to FIG. 6B, the filtered reference voltages Vref+ and Vref– are substituted for presentation to the sampling capacitors Cs. Additionally, capacitor Ccom is placed in parallel with node 52, adding additional capacitance to the node. Since the voltage stored on the sampling capacitors Cs are stable, clean, and well-controlled, the voltage Vcom will be likewise, especially as assisted by the additional capacitance provided by capacitor Ccom. Thus, usage of a single-ended architecture is permitted, without the negative drawbacks suffered by similar approaches (e.g., FIG. 2), which were sensitive to Vcom noise.

Figure 6C:
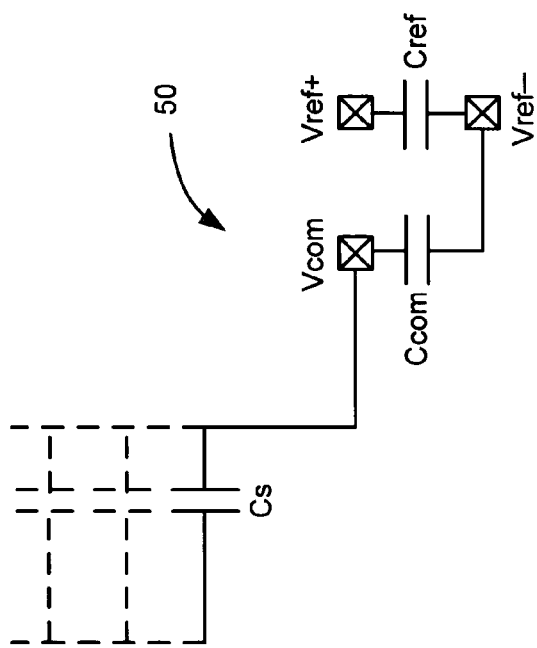

However, to allow the voltage at node 52 to stabilize to its voltage-divided value, a settle phase (($\phi 1s$) is incorporated into phase 1, as illustrated in FIG. 6C. During this settling phase, the sampling capacitors are uncoupled from their data inputs. Also shown in FIG. 6C in dotted lines are additional sampling capacitors that would be present in circuits 50 having multiple data inputs from a multi data-bit output delta sigma modulator. For example, if a four bit output were used, then each branch would have four sampling capacitors. During settling, the lower branch of circuit 50 is preferably decoupled because it is not necessary, as it will not be used to charge the integration capacitor, C1 during phase 2.

Figure 6D:
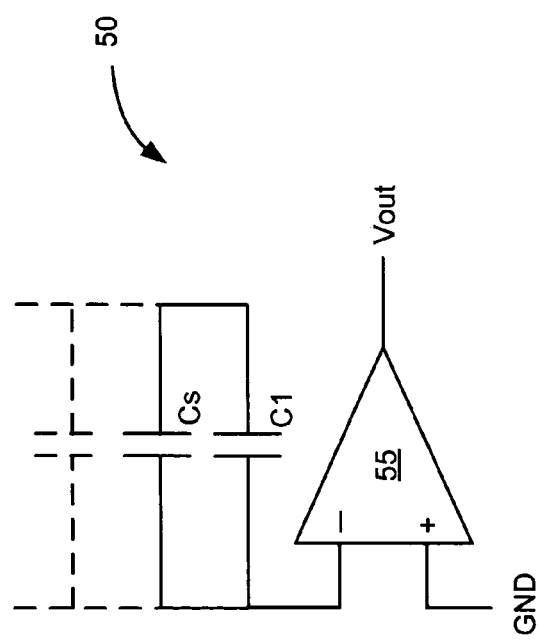
Figure 6E:
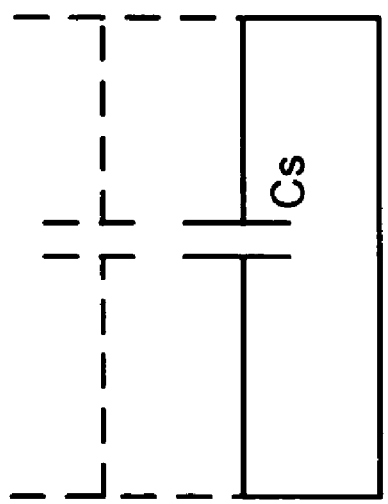
Figure 6E:
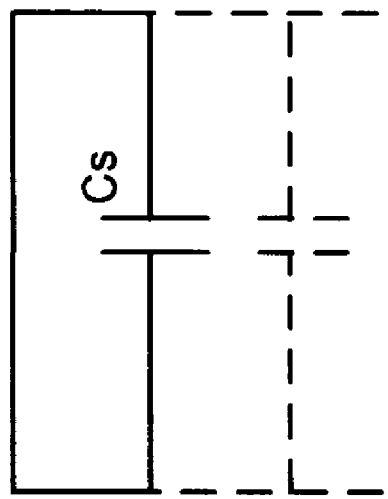

During phase 2 ($\phi 2$ and $\phi 2d$), as shown in FIG. 6D, the sampling capacitor Cs (or capacitors in a multi-bit system) are brought in parallel with the integration capacitor C1 to charge it as explained earlier.

Thereafter, during phase 3 ($\phi 3$), the charge previously established across the sampling capacitors Cs are discharged by shorting the plates of the capacitors together.

Figure 3:
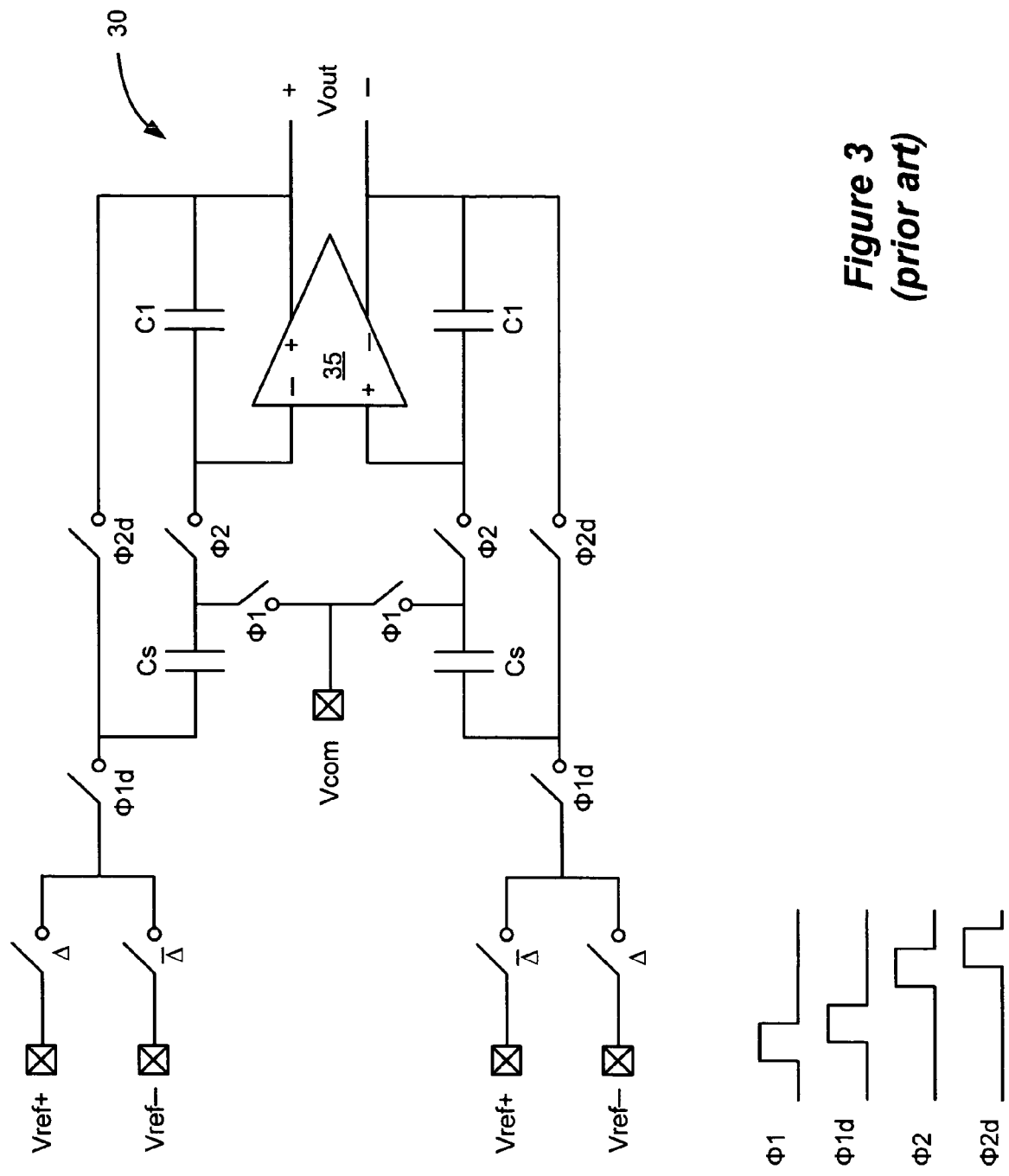
Figure 7A:
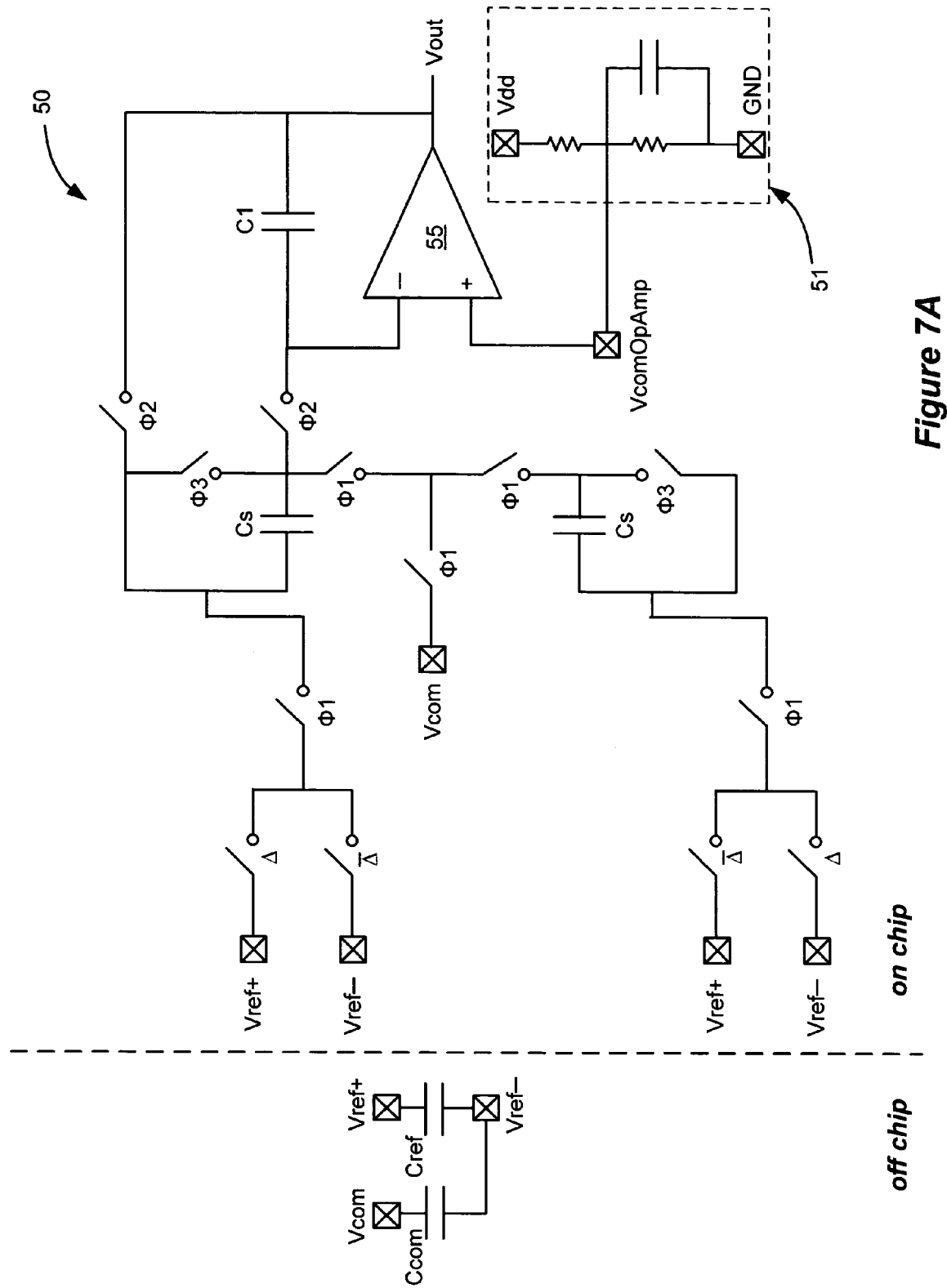
FIGS. 7A and 7B represents alternative simpler embodiments of the circuit and timing diagrams shown in FIGS. 5A and 5B.
Figure 7B:
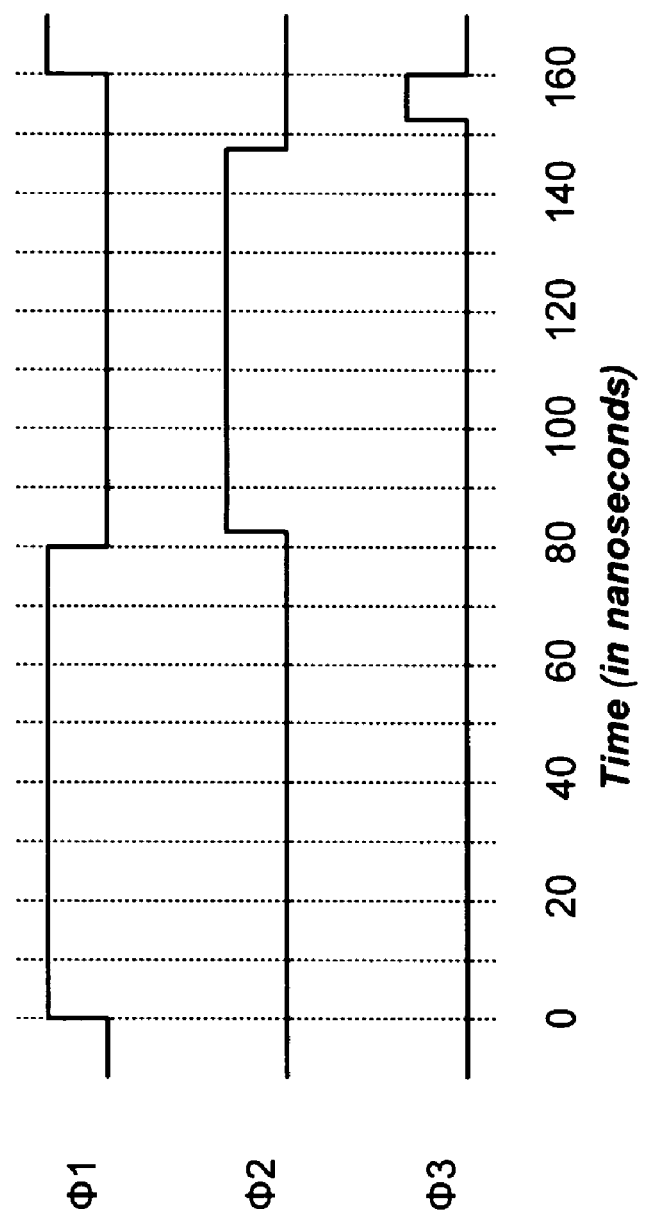

While care has been taken in FIG. 5B to display with some accuracy the duration of the signals and the delay between the signals, these signals durations and delays are merely exemplary and could change depending on user preferences and other circuit parameters and component values. Moreover, as illustrated, the circuit employs delayed phase 1 and 2 signal versions (as in FIG. 3), and employs the scheme of initially charging the sampling capacitors Cs to unfiltered power supply levels (as in FIG. 4). However, the use of such schemes and improvements, while beneficial and preferred, are not required in all useful implementations of the invention. Thus, the use of delayed signaling in the various phases is not required, nor is the scheme of initially charging the sampling capacitors Cs to unfiltered power supply levels assuming that Vref+ and Vref– are actively driven by the power supply voltages, nor is settling. Such simplified use of the invention is thus shown in the simplified circuit of FIG. 7A and its associated simplified timing diagram of FIG. 7B.

It should be understood that the inventive concepts disclosed herein are capable of many modifications. To the extent such modifications fall within the scope of the appended claims and their equivalents, they are intended to be covered by this patent.

What is claimed is:

1. A switched capacitor circuit, comprising:
 a first data path coupled to a first plate of at least one first sampling capacitor during a first operating phase, and a second data path coupled to a first plate of at least one second sampling capacitor during the first operating phase, wherein second plates of the first and second sampling capacitors are coupled during the first operating phase; and
 an integration capacitor coupled across an operational amplifier, and coupled in parallel to the at least one first sampling capacitor during a second operating phase, but wherein the integration capacitor is not coupled in parallel to the at least one second sampling capacitor during the second operating phase;
 a common mode capacitor, wherein the common mode capacitor is coupled to the second plates during at least a portion of the first operating phase,
 wherein the operation amplifier has a single non-differential output.

2. The circuit of claim 1, wherein the second data path is decoupled during the second operating phase.

3. The circuit of claim 1, wherein the data paths contain filtered power supply voltages during at least some portion of the first operating phase.

4. The circuit of claim 1, wherein the data paths contain filtered power supply voltages during only a portion of the first operating phase.

5. The circuit of claim 1, wherein the circuit is an integrated circuit, except for the common mode capacitor, which is externally coupled to the integrated circuit.

6. The circuit of claim 1, wherein the integration capacitor is coupled to a first input of the operational amplifier.

7. The circuit of claim 6, wherein a second input of the operational amplifier is coupled to a common mode voltage.

8. A switched capacitor circuit, comprising:
 a first data path coupled to a first plate of at least one first sampling capacitor during a first operating phase, and a second data path coupled to another first plate of at least one second sampling capacitor during a first operating phase, wherein second plates of the first and second sampling capacitors are coupled during the first operating phase, and wherein a common mode capacitor is coupled to the second plates during at least a portion of the first operating phase; and
 an integration capacitor coupled across an operational amplifier, and coupled in parallel to the at least one first sampling capacitor during a second operating phase, but wherein the integration capacitor is not coupled in parallel to the at least one second sampling capacitor during the second operation phase;
 wherein the operation amplifier has a single non-differential output.

9. The circuit of claim 8, wherein the second data path is decoupled during the second operating phase.

10. The circuit of claim 8, wherein the data paths contain filtered power supply voltages during at least some portion of the first operating phase.

11. The circuit of claim 8, wherein the data paths contain filtered power supply voltages during only a portion of the first operating phase.

12. The circuit of claim 8, wherein the circuit is an integrated circuit, except for the common mode capacitor, which is externally coupled to the integrated circuit.

13. The circuit of claim 8, wherein the integration capacitor is coupled to a first input of the operational amplifier.

14. The circuit of claim 13, wherein a second input of the operational amplifier is coupled to a common mode voltage.

15. A switched capacitor circuit, comprising:
 a first data path for coupling a first logical value to a first plate of at least one first sampling capacitor during a first operating phase, and a second data path for coupling a second logical value to a first plate of at least one second sampling capacitor during the first operating phase, wherein second plates of the first and second sampling capacitors are coupled during the first operating phase, and wherein the second logical value is always a logical inverse of the first logical value;
 a first plate of a common mode capacitor coupled to the second plates of the first and second sampling capacitors during only a portion of the first operating phase which does not include the entire first operating phase; and
 an integration capacitor coupled across an operational amplifier, and coupled in parallel to the at least one first sampling capacitor during a second operating phase,
 wherein a second plate of the common mode capacitor is connected to a reference potential during all operational phases.

16. The circuit of claim 15, wherein the second data path is decoupled during the second operating phase.

17. The circuit of claim 15, wherein the data paths contain filtered power supply voltages during at least some portion of the first operating phase.

18. The circuit of claim 15, wherein the data paths contain filtered power supply voltages during only a portion of the first operating phase.

19. The circuit of claim 15, wherein the circuit is an integrated circuit, except for the common mode capacitor, which is externally coupled to the integrated circuit.

20. The circuit of claim 15, wherein the integration capacitor is coupled to a first input of the operational amplifier.

21. The circuit of claim 20, wherein a second input of the operational amplifier is coupled to a common mode voltage.

22. The circuit of claim 15, wherein the operational amplifier has a single non-differential output.

23. A method for operating a switched capacitor circuit, comprising:
 coupling a first logical value to a first plate of at least one first sampling capacitor while coupling a second logical value to a first plate of at least one second sampling capacitor during a first operating phase, thereby generating a voltage on a node common to both the first and second capacitors, wherein the second logical value is always a logical inverse of the first logical value;
 coupling a first plate of a common mode capacitor to the node, wherein a second plate of the common mode capacitor is hardwired to a reference potential; and
 coupling the at least one first sampling capacitor across an integration capacitor coupled across an operational amplifier to generate a single non-differential output voltage,
 wherein the second sampling capacitor is decoupled from the circuit when the at least one first sampling capacitor is coupled across the integration capacitor.

24. The method of claim 23, wherein the node is common to second plates of the first and second sampling capacitors.

25. The method of claim 23, wherein the first logical value and the second logical value comprise filtered power supply voltages during at least some portion of the first operating phase.

26. The method of claim 23, wherein the first logical value and the second logical value comprise filtered power supply voltages during only a portion of the first operating phase.

27. The method of claim 23, wherein the circuit is an integrated circuit, except for the common mode capacitor, which is externally coupled to the integrated circuit.

28. The method of claim 23, wherein coupling the at least one first sampling capacitor across the integration capacitor comprises coupling the node to a first input of the operational amplifier.

29. The method of claim 28, further comprising coupling a second input of the operational amplifier to a common mode voltage.

30. The method of claim 23, further comprising decoupling the first logical value from the first plate of at least one first sampling capacitor and decoupling the second logical value from the first plate of at least one second sampling capacitor prior to coupling the at least one first sampling capacitor across the integration capacitor.

31. The method of claim 23, further comprising discharging the sampling capacitors after coupling the node across the integration capacitor.

* * * * *